(12) United States Patent
Tochishita

(10) Patent No.: US 10,291,201 B2
(45) Date of Patent: May 14, 2019

(54) ELASTIC WAVE DEVICE AND METHOD FOR MANUFACTURING SAME

(71) Applicant: Murata Manufacturing Co., Ltd., Nagaokakyo-shi, Kyoto-fu (JP)

(72) Inventor: Hikari Tochishita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 421 days.

(21) Appl. No.: 15/352,629

(22) Filed: Nov. 16, 2016

(65) Prior Publication Data

US 2017/0063328 A1 Mar. 2, 2017

Related U.S. Application Data

(63) Continuation of application No. PCT/JP2015/063323, filed on May 8, 2015.

(30) Foreign Application Priority Data

May 20, 2014 (JP) ................ 2014-104382

(51) Int. Cl.
*H03H 9/145* (2006.01)
*H03H 9/02* (2006.01)
(Continued)

(52) U.S. Cl.
CPC .............. *H03H 9/145* (2013.01); *H03H 3/08* (2013.01); *H03H 9/02637* (2013.01);
(Continued)

(58) Field of Classification Search
CPC ...... H03H 9/145; H03H 3/08; H03H 9/02637; H03H 9/059; H03H 9/1071; H03H 9/02992
See application file for complete search history.

(56) References Cited

U.S. PATENT DOCUMENTS 9,035,535 B2* 5/2015 Yamashita ............ H01L 41/053
310/313 A
2007/0046142 A1* 3/2007 Obara ...................... H03H 3/08
310/313 R
(Continued)

FOREIGN PATENT DOCUMENTS

JP 2003-174056 A 6/2003
JP 2005-197595 A 7/2005
(Continued)

OTHER PUBLICATIONS

Official Communication issued in corresponding International Application PCT/JP2015/063323, dated Jun. 23, 2015.

*Primary Examiner* — Bryan P Gordon
(74) *Attorney, Agent, or Firm* — Keating & Bennett, LLP

(57) ABSTRACT

An elastic wave device includes an elastic wave element which includes a piezoelectric substrate, an IDT electrode, and a pad electrode including a joining layer, a package substrate provided with an electrode land, and a bump electrode which joins the pad electrode and the electrode land. The joining layer includes a first principal surface and a second principal surface, the first principal surface side of the joining layer and the bump electrode are joined together to define a joining portion, and an alloy layer is formed at the joining portion. The thickness of the joining layer is about 2,000 nm or less, the thickness of the alloy layer is about 2,100 nm or less, and the distance from a surface of the alloy layer on the piezoelectric substrate side to the second principal surface of the joining layer is about 1,950 nm or less.

17 Claims, 7 Drawing Sheets

(51) Int. Cl.
*H03H 9/05* (2006.01)
*H03H 9/10* (2006.01)
*H03H 3/08* (2006.01)
*H03H 9/25* (2006.01)

(52) U.S. Cl.
CPC ........ *H03H 9/02992* (2013.01); *H03H 9/059* (2013.01); *H03H 9/1071* (2013.01); *H03H 9/25* (2013.01); *H01L 2224/16225* (2013.01)

(56) References Cited

U.S. PATENT DOCUMENTS

| | | | | |
|---|---|---|---|---|
| 2007/0252481 | A1* | 11/2007 | Iwamoto | H03H 9/0576 310/344 |
| 2012/0280768 | A1* | 11/2012 | Nakayama | H03H 9/0057 333/193 |
| 2016/0277003 | A1* | 9/2016 | Kikuchi | H03H 3/08 |

FOREIGN PATENT DOCUMENTS

| JP | 2006-295548 A | 10/2006 |
|---|---|---|
| JP | 2013-012932 A | 1/2013 |
| JP | 2013-172435 A | 9/2013 |

* cited by examiner

ELASTIC WAVE DEVICE AND METHOD FOR MANUFACTURING SAME

CROSS REFERENCE TO RELATED APPLICATIONS

This application claims the benefit of priority to Japanese Patent Application No. 2014-104382 filed on May 20, 2014 and is a Continuation Application of PCT Application No. PCT/JP2015/063323 filed on May 8, 2015. The entire contents of each application are hereby incorporated herein by reference.

BACKGROUND OF THE INVENTION

1. Field of the Invention

The present invention relates to an elastic wave device in which an elastic wave element is mounted on a package substrate with a bump electrode located therebetween and a method for manufacturing the elastic wave device.

2. Description of the Related Art

As one of the techniques for reducing the size of elastic wave devices used in cellular phones and the like, a method of mounting an elastic wave element onto a package substrate using a bump electrode is known.

Japanese Unexamined Patent Application Publication No. 2005-197595 discloses a technique in which a bump electrode is joined to a pad electrode of an elastic wave element. An Al joining layer with a thickness of 840 nm is disposed as an outermost surface layer of the pad electrode, and the Al joining layer is joined to the bump electrode composed of Au. The Al joining layer and the bump electrode are joined together by fusion bonding, and an Au—Al alloy layer is formed at the joining portion between the bump electrode and the Al joining layer.

In the elastic wave device disclosed in Japanese Unexamined Patent Application Publication No. 2005-197595, in some cases, Kirkendall voids may occur in the Au—Al alloy layer when subjected to thermal shock during mounting of the elastic wave element onto a package substrate or during reflow. This may lead to a decrease in the joining strength between the pad electrode and the bump electrode. Consequently, the joining strength between the elastic wave element and the bump electrode may decrease.

SUMMARY OF THE INVENTION

Preferred embodiments of the present invention provide an elastic wave device whose size is able to be reduced, and in which a high joining strength between an elastic wave element and a bump electrode is provided, and a method for manufacturing the elastic wave device.

An elastic wave device according to a preferred embodiment of present invention includes an elastic wave element which includes a piezoelectric substrate, an IDT electrode disposed on the piezoelectric substrate, and a pad electrode electrically connected to the IDT electrode, the pad electrode including a multilayer structure including a wiring layer, a barrier layer, and a joining layer that are provided in this order on the piezoelectric substrate; a package substrate including an electrode land on the surface thereof; and a bump electrode that electrically and mechanically joins the pad electrode and the electrode land and provides a gap between the elastic wave element and the package substrate. The joining layer of the pad electrode includes a first principal surface on the package substrate side and a second principal surface opposite the first principal surface, the first principal surface side of the joining layer and the bump electrode are joined together to define a joining portion, and an alloy layer is provided at the joining portion. The thickness of the joining layer preferably is about 2,000 nm or less, the thickness of the alloy layer preferably is about 2,100 nm or less, and a distance from a surface of the alloy layer on the piezoelectric substrate side to the second principal surface of the joining layer preferably is about 1,950 nm or less, for example.

According to a preferred embodiment of the present invention, a maximum diameter of voids that are included in the alloy layer preferably is about 250 nm or less, for example.

According to a preferred embodiment of the present invention, the surface of the alloy layer on the piezoelectric substrate side extends to the second principal surface of the joining layer.

According to a preferred embodiment of the present invention, the surface of the alloy layer on the piezoelectric substrate side is located between the first principal surface and the second principal surface of the joining layer.

According to a preferred embodiment of the present invention, a thickness of the joining layer is about 450 nm or less.

According to a preferred embodiment of the present invention, the elastic wave device further includes a mold resin layer provided on the package substrate to cover an outer periphery of the elastic wave element.

According to a preferred embodiment of the present invention, the joining layer includes Al or an alloy of Al and at least one selected from the group including Cu, W, Ti, Cr, Ta, and Si.

According to a preferred embodiment of the present invention, the bump electrode includes Au.

A method for manufacturing an elastic wave device according to a preferred embodiment of the present invention includes a step of preparing an elastic wave element in which the thickness of the joining layer of the pad electrode is about 2,000 nm or less, a step of joining the bump electrode to the pad electrode of the elastic wave element by bump bonding, and a step of mounting the elastic wave element including the bump electrode joined thereto onto a package substrate by flip chip bonding. In the step of mounting the elastic wave element onto the package substrate, during the flip chip bonding, heat is applied to form an alloy layer at the joining portion between the joining layer of the pad electrode and the bump electrode, at a distance of about 1,950 nm or less from the second principal surface of the joining layer of the pad electrode, and with a thickness of about 2,100 nm or less.

According to a preferred embodiment of the present invention, in the step of preparing the elastic wave element, the elastic wave element is prepared with the thickness of the joining layer of the pad electrode of about 450 nm or less.

According to preferred embodiments of the present invention, elastic wave devices whose sizes are able to be reduced is provided, and in which a high joining strength between an elastic wave element and a bump electrode is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments of the present invention with reference to the drawings.

It is to be noted that the preferred embodiments described in the specification are merely examples, and that the configurations in the preferred embodiments are able to be partly replaced or combined between different preferred embodiments.

First Preferred Embodiment

Figure 1A:
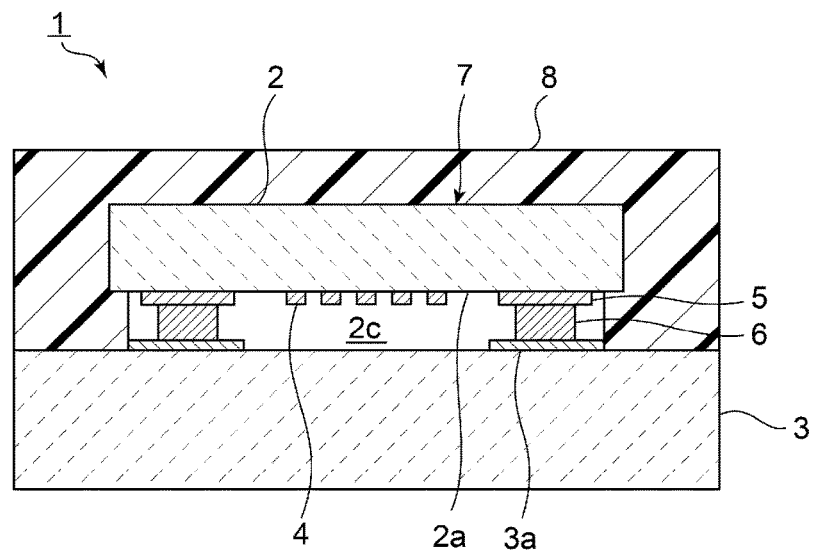
FIG. 1A is a schematic elevational cross-sectional view of an elastic wave device according to a first preferred embodiment of the present invention.
Figure 1B:
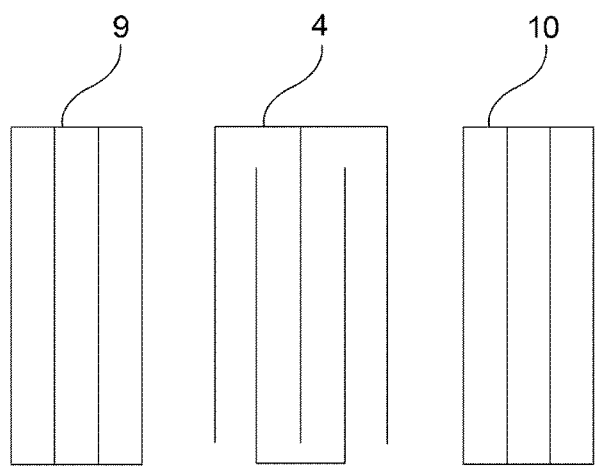
FIG. 1B is a schematic plan view showing an electrode structure of an elastic wave element included in the elastic wave device according to the first preferred embodiment of the present invention.

FIG. 1A is a schematic elevational cross-sectional view of an elastic wave device according to a first preferred embodiment of the present invention, and FIG. 1B is a schematic plan view showing an electrode structure of an elastic wave element included in the elastic wave device according to the first preferred embodiment.

Figure 2:
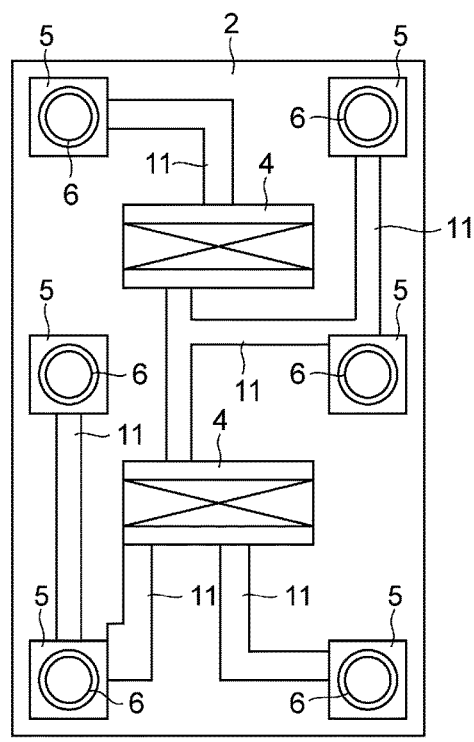
FIG. 2 is a schematic plan view showing an interconnect structure of the elastic wave element included in the elastic wave device according to the first preferred embodiment of the present invention.

FIG. 2 is a schematic plan view showing an interconnect structure of the elastic wave element included in the elastic wave device according to the first preferred embodiment.

An elastic wave device 1 includes an elastic wave element 7. The elastic wave element 7 includes a piezoelectric substrate 2, an IDT electrode 4, and pad electrodes 5. The piezoelectric substrate 2 includes a principal surface 2a. The piezoelectric substrate 2 may include a substrate with a piezoelectric single crystal, such as $LiTaO_3$ or $LiNbO_3$.

The IDT electrode 4 is disposed on the principal surface 2a of the piezoelectric substrate 2. The IDT electrode 4 may include an appropriate metal material, such as Al, Cu, Pt, Au, Ag, Ti, Ni, Cr, Mo, W, or an alloy that primarily includes any of these metals. The IDT electrode 4 may be single-layered or a multilayer body in which two or more metal layers are stacked. In the first preferred embodiment, a Ti layer and an AuCu alloy layer are stacked in this order on the principal surface 2a of the piezoelectric substrate 2 to provide the IDT electrode 4.

Although schematically shown in FIG. 1A, an electrode structure shown in FIG. 1B is disposed on the piezoelectric substrate 2. That is, the IDT electrode 4 and reflectors 9 and 10 are located on both sides in or substantially in the surface acoustic wave propagation direction of the IDT electrode 4, thus providing a one-port surface acoustic wave resonator. However, in the first preferred embodiment, the electrode structure including an IDT electrode is not particularly limited. A filter may be provided by combining a plurality of resonators. Examples of such a filter include a ladder filter, a longitudinally coupled resonator filter, and a lattice filter.

The pad electrodes 5 are stacked on the principal surface 2a of the piezoelectric substrate 2. The pad electrodes are electrically connected to the IDT electrode 4. The pad electrodes 5 include appropriate metals. Specifically, metal layers, which are described below, are stacked in each pad electrode 5.

In FIG. 1A, to provide an easier understanding of the structure of the first preferred embodiment, the IDT electrode 4 and the pad electrodes 5 only are shown on the principal surface 2a of the piezoelectric substrate 2. However, in practice, as shown in the schematic plan view of FIG. 2, a line electrode 11 for connecting the IDT electrode 4 and the pad electrodes 5 is further provided on the piezoelectric substrate 2.

Referring back to FIG. 1A, the elastic wave element 7 is mounted onto a package substrate 3. The package substrate 3 includes a shape of a rectangular or substantially rectangular plate. The package substrate 3 may include an insulating ceramic such as alumina, an insulating resin, or the like.

The elastic wave element 7 is electrically and mechanically joined to the package substrate 3 with the bump electrodes 6 located therebetween. More specifically, as shown in FIG. 1A, the pad electrodes 5, which are components of the elastic wave element 7, are joined to the bump electrodes 6. Electrode lands 3a are included on the upper surface of the package substrate 3. The electrode lands 3a are joined to the bump electrodes 6.

As shown in FIG. 1A, in the first preferred embodiment, a hollow space 2c is defined by the pad electrodes 5 of the elastic wave element 7, the bump electrodes 6, and the package substrate 3. The IDT electrode 4 on the piezoelectric substrate 2 faces the hollow space 2c. Accordingly, a chip-size package structure is able to be provided.

In the first preferred embodiment, the bump electrodes 6 and the electrode lands 3a of the package substrate 3 include Au. However, the bump electrodes 6 and the electrode lands 3a of the package substrate 3 may include another appropriate metal material.

A mold resin layer 8 is provided on the package substrate 3 to cover the elastic wave element 7. A material for the mold resin layer 8 includes, for example, an appropriate resin such as an epoxy resin.

Figure 3:
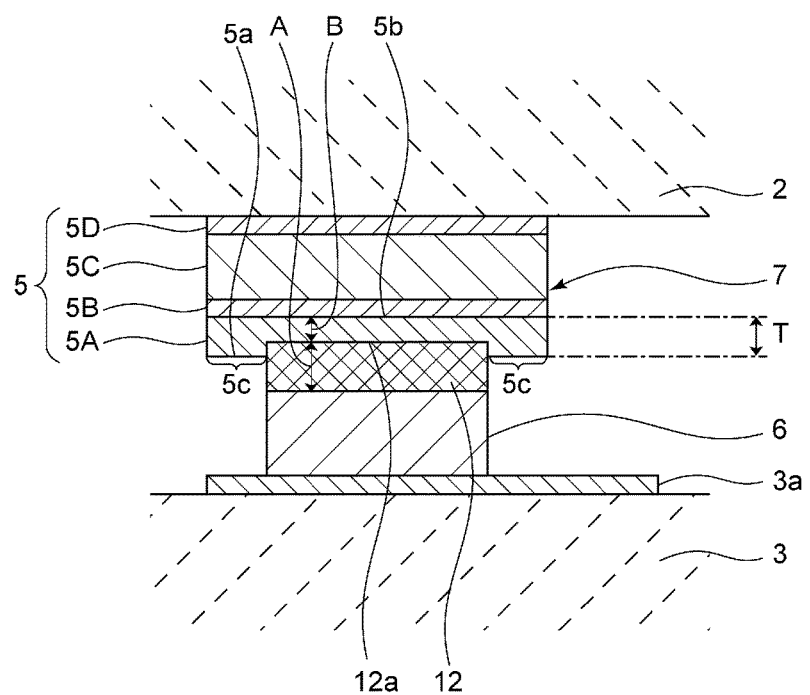
FIG. 3 is an enlarged schematic cross-sectional view of a joining portion between an elastic wave element and a package substrate in an elastic wave device according to the first preferred embodiment of the present invention.

FIG. 3 is an enlarged schematic cross-sectional view of a joining portion between the elastic wave element 7 and the package substrate 3 in the elastic wave device 1 according to the first preferred embodiment. A pad electrode 5 includes an adhesion layer 5D, a wiring layer 5C, a barrier layer 5B, and a joining layer 5A. The adhesion layer 5D, the wiring layer 5C, the barrier layer 5B, and the joining layer 5A are stacked in this order on the piezoelectric substrate 2. In order to increase the joining strength between the piezoelectric substrate 2 and the wiring layer 5C, the piezoelectric substrate 2 and the wiring layer 5C are joined with the adhesion layer 5D of Ti located therebetween. However, the adhesion layer 5D may be omitted.

The wiring layer 5C includes an alloy of Al and Cu (AlCu alloy). The barrier layer 5B includes Ti.

The joining layer 5A includes a first principal surface 5a and a second principal surface 5b. The joining layer 5A includes Al or an alloy of Al and another metal. The other metal is at least one selected from the group including Cu, W, Ti, Cr, Ta, and Si. In the first preferred embodiment, the joining layer 5A includes Al.

As shown in FIG. 3, the joining layer 5A of the pad electrode 5 is joined to the bump electrode 6. The joining layer 5A includes the first principal surface 5a and the second principal surface 5b, which are opposite to each other. The first principal surface 5a of the joining layer 5A is located on a side of the joining layer 5A closer to the package substrate 3 and is joined to the bump electrode 6. The second principal surface 5b of the joining layer 5A is located on a side of the joining layer 5A closer to the piezoelectric substrate 2. An alloy layer 12 is generated at a joining portion defined by metal diffusion between the Al joining layer 5A and the Au bump electrode 6. The alloy layer 12 includes an AuAl alloy. In the first preferred embodiment, the alloy layer 12 does not extend to the second principal surface 5b of the joining layer 5A. That is, a surface 12a of the alloy layer 12 on a side of the alloy layer 12 closer to the piezoelectric substrate 2 is located between the first principal surface 5a and the second principal surface 5b of the joining layer 5A.

In the first preferred embodiment, the thickness T of the joining layer 5A preferably is about 2,000 nm or less, for example. More specifically, in a direction parallel or substantially parallel to the normal of the first principal surface 5a, the thickness of a remaining portion 5c of the joining layer 5A (excluding the joining portion between the joining layer 5A and the bump electrode 6) corresponds to the thickness T of the joining layer 5A. That is, in the thickness direction, the distance from the first principal surface 5a to the second principal surface 5b of the joining layer 5A preferably is about 2,000 nm or less, for example. Furthermore, as described in detail below, if the thickness T of the joining layer 5A is set to be about 450 nm or less, when the entire thickness of the joining layer 5A is transformed with the bump electrode 6 into the alloy layer 12, the thickness A of the alloy layer 12 provided by transformation of the joining layer 5A and the bump electrode 6 is able to be controlled to be about 2,100 nm or less, for example. Note that the direction parallel or substantially parallel to the normal of the first principal surface is referred to as the thickness direction.

Furthermore, in the first preferred embodiment, in the thickness direction, the distance from the surface 12a of the alloy layer 12 on the piezoelectric substrate 2 side to the second principal surface 5b of the joining layer 5A preferably is about 1,950 nm or less, and the thickness A of the alloy layer 12 between the joining layer 5A and the bump electrode 6 preferably is about 2,100 nm or less, for example. By setting the thickness B of an unalloyed layer in the joining layer 5A, from the surface 12a which is the boundary of the alloy layer 12 on the piezoelectric substrate 2 side to the second principal surface 5b of the jointing layer 5A, to be about 1,950 nm or less and the thickness A of the alloy layer 12 to be about 2,100 nm or less, for example, the amount of interdiffusion between the alloy layer 12 and the unalloyed layer due to an increase in ambient temperature is able to be controlled. The occurrence of voids due to an imbalance in the rate of diffusion during the interdiffusion, that is, the occurrence of Kirkendall voids, is able to be significantly reduced or prevented.

As described above, in the first preferred embodiment, the thickness of the remaining portion 5c of the joining layer 5A (excluding the joining portion between the joining layer 5A and the bump electrode 6), that is, the thickness T of the joining layer 5A, the distance from the surface 12a of the alloy layer 12 on the piezoelectric substrate 2 side to the second principal surface 5b of the joining layer 5A, and the thickness A of the alloy layer 12 are limited to the ranges described above, Kirkendall voids are unlikely to occur in the joining portion between the joining layer 5A and the bump electrode 6. In particular, Kirkendall voids are unlikely to occur in the alloy layer 12 and at the interface between the alloy layer 12 and the bump electrode 6 or the joining layer 5A. Even if Kirkendall voids occur, the maximum diameter of the Kirkendall voids is about 250 nm or less, for example. If the cross-sectional shape of Kirkendall voids is not circular but elliptical, the length of the major axis of the Kirkendall voids is about 250 nm or less, for example. Furthermore, if Kirkendall voids are of irregular shape including a longitudinal direction, the maximum external size of the Kirkendall voids is about 250 nm or less, for example.

Accordingly, even when subjected to thermal shock, the joining strength between the joining layer 5A and the bump electrode 6 is unlikely to be decreased. Therefore, a chip-size package structure provides a reduction in size.

In a method for manufacturing an elastic wave device 1, first, an elastic wave element 7 is prepared, in which an IDT electrode 4 and a pad electrode 5 are provided on a piezoelectric substrate 2. In the pad electrode 5, the thickness T of a joining layer 5A preferably is about 2,000 nm or less, for example. To further significantly reduce or prevent the occurrence of Kirkendall voids, in the pad electrode 5, the thickness T of the joining layer 5A is preferably about 450 nm or less, for example.

Then, a bump electrode 6 is joined by bump bonding to the joining layer 5A of the pad electrode 5 of the elastic wave element 7. Subsequently, the elastic wave element 7 including the bump electrode 6 joined thereto is mounted onto a package substrate 3 by flip chip bonding, thus providing the elastic wave device 1.

In the method for manufacturing an elastic wave device according to the first preferred embodiment, during the flip chip bonding, heat is applied to form an alloy layer at the joining portion between the joining layer of the pad electrode and the bump electrode, at a distance of about 1,950 nm or less from the second principal surface of the joining layer of the pad electrode, and with a thickness of about 2,100 nm or less, for example.

Accordingly, the occurrence of Kirkendall voids in the joining portion between the joining layer of the pad electrode and the bump electrode is able to be significantly reduced or prevented. That is, an elastic wave device is able to be provided with a high joining strength between an elastic wave element and a bump electrode.

Second Preferred Embodiment

Figure 4:
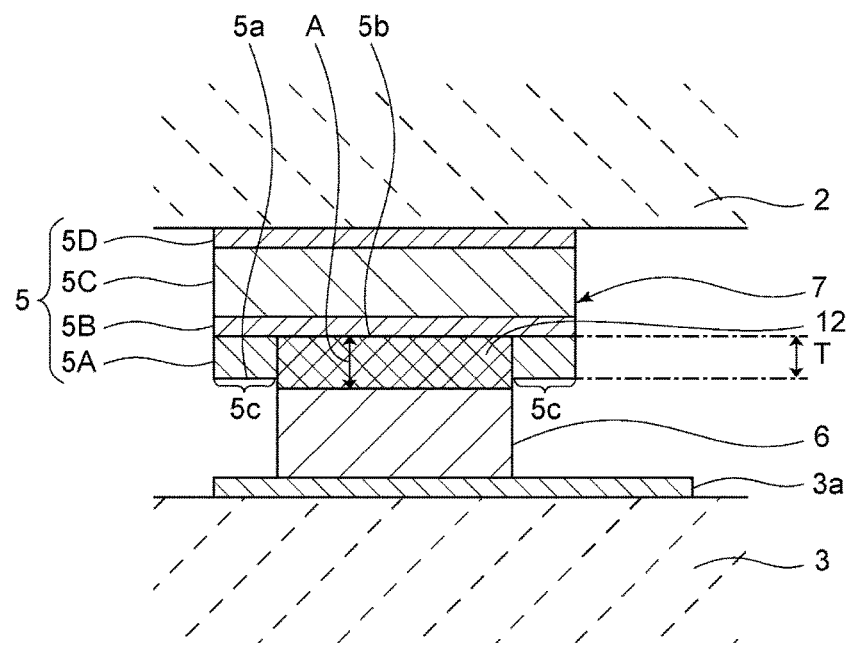
FIG. 4 is an enlarged schematic cross-sectional view of a joining portion between an elastic wave element and a package substrate in an elastic wave device according to a second preferred embodiment of the present invention.

FIG. 4 is an enlarged schematic cross-sectional view of a joining portion between an elastic wave element 7 and a package substrate 3 in an elastic wave device according to a second preferred embodiment of the present invention. In the second preferred embodiment, an alloy layer 12 extends to a second principal surface 5b of a joining layer 5A. Otherwise, the second preferred embodiment includes a structure that is the same as or similar to the structure of the first preferred embodiment.

As described above, in the elastic wave device according to the second preferred embodiment, since the alloy layer 12 extends to the second principal surface 5b of the joining layer 5A, the occurrence of Kirkendall voids in the joining portion between the joining layer 5A and the bump electrode 6 is able to be further significantly reduced or prevented. Accordingly, a decrease in the joining strength between the elastic wave element 7 and the bump electrode 6 due to thermal shock is able to be further significantly reduced or prevented.

Furthermore, to more effectively reduce or prevent the occurrence of Kirkendall voids, the alloy layer 12 may extend over the second principal surface 5b of the joining layer 5A to the barrier layer 5B which is a diffusion prevention layer.

FIGS. 5 to 8 are each an SEM photograph at a magnification of 5,500× of a cross section of a joining portion between an elastic wave element 7 and a bump electrode 6 of a sample in which the thickness T of the joining layer is set to be about 250 nm, about 350 nm, about 450 nm, or about 650 nm, for example, in an elastic wave device according to the second preferred embodiment. FIGS. 5 to 8 each show a cross-sectional view of a portion where a piezoelectric substrate 2, a pad electrode 5, an alloy layer 12, and a bump electrode 6 are stacked in this order from the top.

Hereinafter, the thickness T of the joining layer 5A refers to the distance between the first principal surface and the second principal surface of the joining layer 5A, and as shown in FIGS. 3 and 4, the thickness T of the joining layer 5A refers to the thickness of a remaining portion 5c of the joining layer 5A excluding a portion overlapping the joining portion in the thickness direction.

The pad electrode 5 is formed preferably by stacking the adhesion layer 5D, the wiring layer 5C, the barrier layer 5B, and the joining layer 5A or the alloy layer 12 formed between the joining layer 5A and the bump electrode 6 in this order from the piezoelectric substrate 2 side. In order to increase the joining strength between the piezoelectric substrate 2 and the wiring layer 5C, the piezoelectric substrate 2 and the wiring layer 5C are joined with the adhesion layer 5D of Ti located therebetween. However, the adhesion layer 5D may be omitted.

Figure 5:
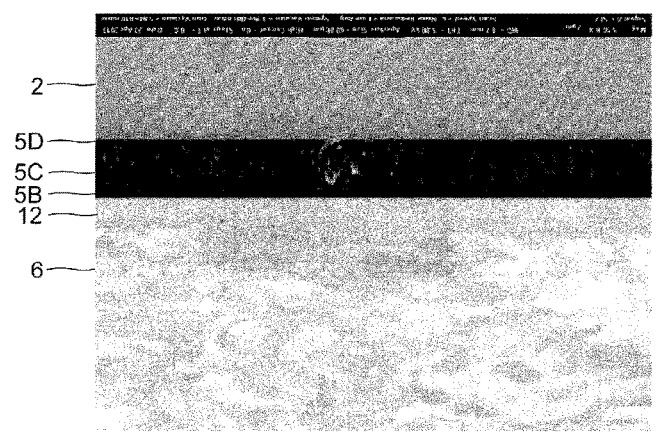
FIG. 5 is an SEM photograph at a magnification of 5,500× of a cross section of a joining portion between an elastic wave element and a bump electrode of a sample in which the thickness of a remaining portion of the joining layer (excluding the joining portion between the joining layer and the bump electrode) is set to be about 250 nm in an elastic wave device according to the second preferred embodiment of the present invention.
Figure 6:
FIG. 6 is an SEM photograph at a magnification of 5,500× of a cross section of a joining portion between an elastic wave element and a bump electrode of a sample in which the thickness of a remaining portion of the joining layer (excluding the joining portion between the joining layer and the bump electrode) is set to be about 350 nm in an elastic wave device according to the second preferred embodiment of the present invention.

As shown in FIGS. 5 and 6, when the thickness T of the joining layer 5A is about 250 nm or about 350 nm, for example, Kirkendall voids do not occur.

Figure 7:
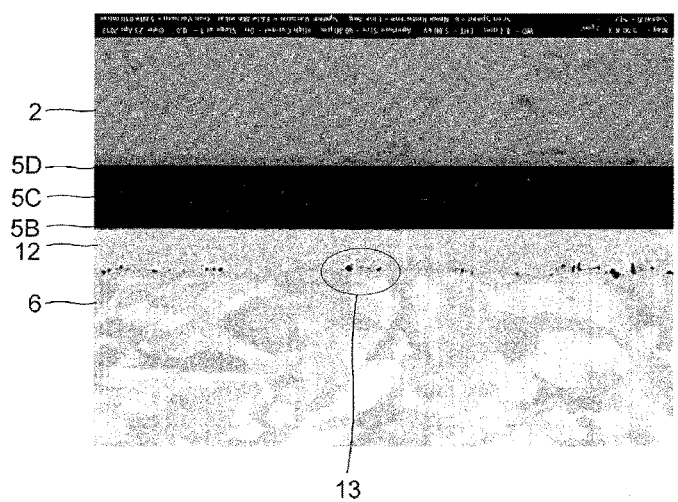
FIG. 7 is an SEM photograph at a magnification of 5,500× of a cross section of a joining portion between an elastic wave element and a bump electrode of a sample in which the thickness of a remaining portion of the joining layer (excluding the joining portion between the joining layer and the bump electrode) is set to be about 450 nm in an elastic wave device according to the second preferred embodiment of the present invention.

In the sample shown in FIG. 7, in which the thickness T of the joining layer 5A is about 450 nm, although Kirkendall voids 13 occur in the joining portion between the alloy layer 12 and the bump electrode 6, the maximum diameter of the Kirkendall voids 13 is about 250 nm or less, for example.

Figure 8:
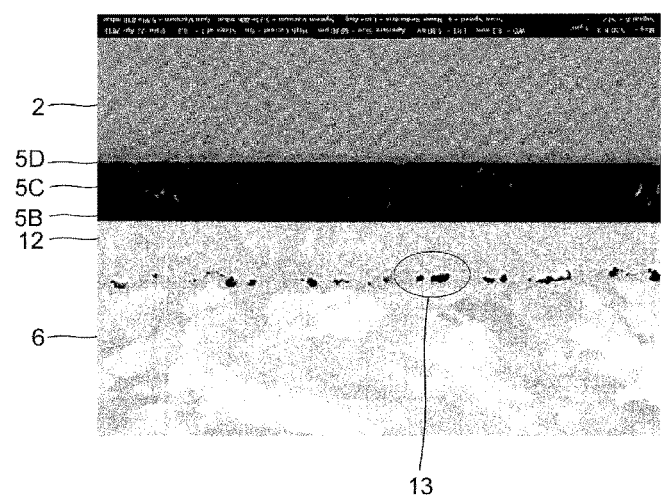
FIG. 8 is an SEM photograph at a magnification of 5,500× of a cross section of a joining portion between an elastic wave element and a bump electrode of a sample in which the thickness of a remaining portion of the joining layer (excluding the joining portion between the joining layer and the bump electrode) is set to be about 650 nm in an elastic wave device according to the second preferred embodiment of the present invention.

However, in the sample shown in FIG. 8, in which the thickness T of the joining layer 5A is about 650 nm, Kirkendall voids 13 including a maximum diameter of more than about 250 nm are observed.

The results of SEM photograph observation show that when the thickness T of the joining layer 5A is about 350 nm or less, the occurrence of Kirkendall voids 13 is significantly reduced or prevented, and when the thickness T of the joining layer 5A is about 450 nm or less, the occurrence of Kirkendall voids 13 including a maximum diameter of more than about 250 nm is significantly reduced or prevented.

Figure 9:
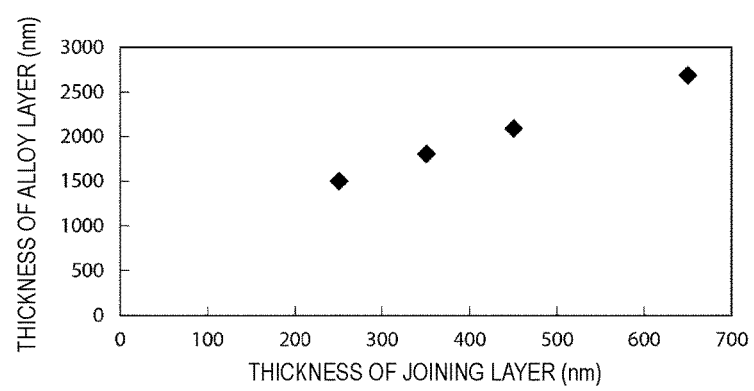
FIG. 9 is a graph showing the relationship between the thickness of the joining layer and the thickness of the alloy layer in elastic wave devices according to the second preferred embodiment of the present invention.

FIG. 9 is a graph showing the relationship between the thickness T of the joining layer 5A and the thickness A of the alloy layer 12. As shown in FIG. 9, there is a proportional relation between the thickness T of the joining layer 5A and the thickness A of the alloy layer 12. Furthermore, when the thickness T of the joining layer 5A is about 450 nm, the thickness A of the alloy layer 12 is about 2,100 nm, for example. Therefore, when the thickness A of the alloy layer 12 is about 2,100 nm or less, the occurrence of Kirkendall voids 13 including a maximum diameter of more than about 250 nm is significantly reduced or prevented.

Accordingly, in the second preferred embodiment in which the alloy layer 12 extends to the second principal surface 5b of the joining layer 5A, preferably, the thickness T of the joining layer 5A is about 450 nm or less, that is, the thickness A of the alloy layer 12 is about 2,100 nm or less, for example.

Furthermore, to significantly reduce or prevent the occurrence of Kirkendall voids 13, more preferably, the thickness T of the joining layer 5A is about 350 nm or less, that is, the thickness A of the alloy layer 12 is about 1,800 nm or less, for example.

Furthermore, to securely significantly reduce or prevent the occurrence of Kirkendall voids 13, still more preferably, the thickness T of the joining layer 5A is about 250 nm or less, that is, the thickness A of the alloy layer 12 is about 1,500 nm or less, for example.

Figure 10:
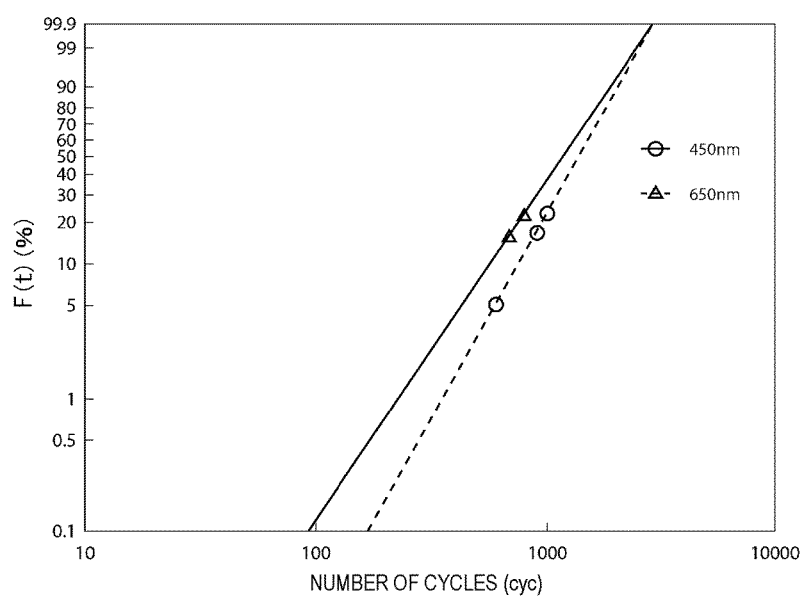
FIG. 10 is a graph showing thermal shock test results when the thickness of the joining layer is set to be about 450 nm and about 650 nm in elastic wave devices according to the second preferred embodiment of the present invention.

FIG. 10 is a graph showing thermal shock test results when the thickness T of the joining layer 5A is set to be about 450 nm and about 650 nm in elastic wave devices according to the second preferred embodiment. In the graph shown in FIG. 10, the vertical axis indicates the failure probability F(t) of elastic wave devices according to a thermal shock test, and the horizontal axis indicates the number of cycles in the thermal shock test.

Specifically, 30 samples were subjected to N times of thermal shock in a cycle test, one cycle including a temperature increase from about −40° C. to about 125° C. and a temperature decrease from about 125° C. to about −40° C., and then the resistance between the pad electrode 5 and the electrode land 3a at room temperature (about 25° C.) was measured in accordance with the Japanese Industrial Standard (JIS C 60068-2-14). The retention time at each temperature was set to be about 30 minutes.

A sample measured to include an open circuit between the pad electrode 5 and the electrode land 3a was considered a failed sample. The failure probability F(t) was calculated in accordance with the following formula:

Failure probability $F(t)$=number of failed samples/ number of tested samples×100

As shown in FIG. 10, the samples in which the thickness T of the joining layer 5A is about 450 nm provide a lower failure probability than the samples in which the thickness T of the joining layer 5A is about 650 nm. Furthermore, although not shown, in samples in which the thickness T of the joining layer 5A is about 250 nm, no samples failed even at 1,000 cycles.

The results of the thermal shock test confirmed that as the thickness T of the joining layer 5A decreases, the failure probability due to thermal shock decreases. That is, as the thickness T of the joining layer 5A decreases, a decrease in the joining strength between the elastic wave element 7 and the bump electrode 6 is further significantly reduced or prevented.

As described above, in the elastic wave device according to the second preferred embodiment, in which the alloy layer 12 extends to the second principal surface 5b of the joining layer 5A, by setting the thickness T of the joining layer 5A to be about 450 nm or less, that is, by setting the thickness A of the alloy layer 12 to be about 2,100 nm or less, the occurrence of Kirkendall voids including a maximum diameter of more than about 250 nm is able to be significantly reduced or prevented. As a result, a decrease in the joining strength between the elastic wave element 7 and the bump electrode 6 due to thermal shock is able to be significantly reduced or prevented.

Furthermore, by setting the thickness T of the joining layer 5A to be about 350 nm or less, that is, by setting the thickness A of the alloy layer 12 to be about 1,800 nm or less, the occurrence of Kirkendall voids is significantly reduced or prevented, and, therefore, a decrease in the joining strength between the elastic wave element 7 and the bump electrode 6 due to thermal shock is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an elastic wave element which includes a piezoelectric substrate, an IDT electrode disposed on the piezoelectric substrate, and a pad electrode electrically connected to the IDT electrode, the pad electrode including a multilayer structure including a wiring layer, a barrier layer, and a joining layer that are provided in order on the piezoelectric substrate;
   a package substrate including an electrode land on a surface thereof; and
   a bump electrode that electrically and mechanically joins the pad electrode and the electrode land and provides a gap between the elastic wave element and the package substrate; wherein
   the joining layer of the pad electrode includes a first principal surface on the package substrate side and a second principal surface opposite the first principal surface, the first principal surface side of the joining layer and the bump electrode are joined together to define a joining portion, and an alloy layer is located at the joining portion; and
   a thickness of the joining layer is about 2,000 nm or less, a thickness of the alloy layer is about 2,100 nm or less, and a distance from a surface of the alloy layer on a piezoelectric substrate side to the second principal surface of the joining layer is about 1,950 nm or less.

2. The elastic wave device according to claim 1, wherein a maximum diameter of voids that are included in the alloy layer is about 250 nm or less.

3. The elastic wave device according to claim 1, wherein the surface of the alloy layer on the piezoelectric substrate side extends to the second principal surface of the joining layer.

4. The elastic wave device according to claim 1, wherein the alloy layer does not extend to the second principal surface of the joining layer.

5. The elastic wave device according to claim 1, wherein the surface of the alloy layer on the piezoelectric substrate side is located between the first principal surface and the second principal surface of the joining layer.

6. The elastic wave device according to claim 1, wherein the thickness of the joining layer is about 450 nm or less.

7. The elastic wave device according to claim 1, further comprising a mold resin layer provided on the package substrate to cover an outer periphery of the elastic wave element.

8. The elastic wave device according to claim 1, wherein the joining layer includes Al or an alloy of Al and at least one selected from the group consisting of Cu, W, Ti, Cr, Ta, and Si.

9. The elastic wave device according to claim 1, wherein the bump electrode includes Au.

10. The elastic wave device according to claim 1, further comprising at least one reflector located in or substantially in a surface acoustic wave propagation direction of the IDT electrode.

11. The elastic wave device according to claim 10, wherein the IDT electrode and the at least one reflector define a one-port surface acoustic wave resonator.

12. The elastic wave device according to claim 1, wherein the package includes an insulating ceramic.

13. The elastic wave device according to claim 1, wherein the thickness of the joining layer and the thickness of the alloy layer include a predetermined proportional relationship.

14. The elastic wave device according to claim 1, wherein the wiring layer includes an alloy of Al and Cu.

15. The elastic wave device according to claim 1, wherein the alloy layer includes an alloy of Au and Cl.

16. A method for manufacturing the elastic wave device according to claim 1, the method comprising:
   a step of preparing the elastic wave element in which the thickness of the joining layer of the pad electrode is about 2,000 nm or less;
   a step of joining the bump electrode to the pad electrode of the elastic wave element by bump bonding; and
   a step of mounting the elastic wave element including the bump electrode joined thereto onto the package substrate by flip chip bonding; wherein
   in the step of mounting the elastic wave element onto the package substrate, during the flip chip bonding, heat is applied to form the alloy layer at the joining portion between the joining layer of the pad electrode and the bump electrode, at a distance of about 1,950 nm or less from the second principal surface of the joining layer of the pad electrode, and with the thickness of about 2,100 nm or less.

17. The method for manufacturing the elastic wave device according to claim 16, wherein, in the step of preparing the elastic wave element, the elastic wave element is prepared with the thickness of the joining layer of the pad electrode of 450 nm or less.

\* \* \* \* \*